United States Patent
Fang et al.

(10) Patent No.: US 11,930,679 B2
(45) Date of Patent: Mar. 12, 2024

(54) ARRAY SUBSTRATE, PREPARATION METHOD THEREFOR, AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Jingang Fang, Beijing (CN); Luke Ding, Beijing (CN); Jun Liu, Beijing (CN); Bin Zhou, Beijing (CN); Jun Cheng, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 549 days.

(21) Appl. No.: 17/264,283

(22) PCT Filed: May 12, 2020

(86) PCT No.: PCT/CN2020/089820
§ 371 (c)(1),
(2) Date: Jan. 28, 2021

(87) PCT Pub. No.: WO2020/233453
PCT Pub. Date: Nov. 26, 2020

(65) Prior Publication Data
US 2021/0296406 A1    Sep. 23, 2021

(30) Foreign Application Priority Data
May 17, 2019 (CN) .......................... 201910412086.1

(51) Int. Cl.
*H10K 59/35* (2023.01)
*H01L 27/12* (2006.01)
(Continued)

(52) U.S. Cl.
CPC ......... *H10K 59/353* (2023.02); *H10K 50/865* (2023.02); *H10K 59/1213* (2023.02); *H10K 71/00* (2023.02); *H10K 59/1201* (2023.02)

(58) Field of Classification Search
CPC .... H10K 59/353; H10K 59/124; H10K 59/38; H10K 50/81; H10K 50/813;
(Continued)

(56) References Cited

U.S. PATENT DOCUMENTS

2008/0197357 A1    8/2008 Park et al.
2011/0074272 A1    3/2011 Sakamoto et al.
(Continued)

FOREIGN PATENT DOCUMENTS

CN    102708792 A    10/2012
CN    103855170 A    6/2014
(Continued)

OTHER PUBLICATIONS

CN201910412086.1 First Office Action.

*Primary Examiner* — Sonya McCall-Shepard
(74) *Attorney, Agent, or Firm* — IPro, PLLC

(57) ABSTRACT

The present disclosure relates to the technical field of display, and discloses an array substrate, a preparation method therefor, and a display device. When dielectric layers, such as a buffer layer, an interlayer dielectric layer, and a gate insulation layer, are formed between a source-drain electrode and a substrate, the thickness of at least one dielectric layer among said dielectric layers underneath a first through hole for connecting a drain electrode and an anode is increased, which is to say that the drain electrode (Continued)

is raised to be further away from the substrate, causing the drain electrode to be closer to a surface of a planarization layer that faces away from the substrate, i.e., reducing the thickness of a portion of the planarization layer above the drain electrode.

20 Claims, 6 Drawing Sheets

(51) Int. Cl.
| | |
|---|---|
| *H10K 50/86* | (2023.01) |
| *H10K 59/12* | (2023.01) |
| *H10K 59/121* | (2023.01) |
| *H10K 59/123* | (2023.01) |
| *H10K 59/124* | (2023.01) |
| *H10K 71/00* | (2023.01) |

(58) Field of Classification Search
CPC ......... H10K 50/805; H10K 59/80515; H10K 59/122; H10K 59/1213; H10K 59/35; H10K 59/352; H10K 59/123; H10K 59/126; H10K 71/00; H10K 59/1201; H10K 59/8051; H10K 59/131; H10K 59/1315; H10K 50/86; H10K 59/12; H01L 27/1248; H01L 29/78633; H01L 27/12–1251; H01L 21/823462
See application file for complete search history.

(56) References Cited

U.S. PATENT DOCUMENTS

| | | |
|---|---|---|
| 2013/0087794 A1 | 4/2013 | Kwack |
| 2013/0120981 A1* | 5/2013 | Kim ..................... H10K 59/351 |
| | | 362/231 |
| 2014/0306229 A1 | 10/2014 | Ono |
| 2015/0263077 A1 | 9/2015 | Kim et al. |
| 2016/0240143 A1 | 8/2016 | Qi et al. |
| 2017/0278913 A1 | 9/2017 | Zhang |
| 2018/0151831 A1* | 5/2018 | Lee ..................... H10K 50/844 |
| 2018/0190730 A1 | 7/2018 | Cho et al. |
| 2019/0207150 A1* | 7/2019 | Kwon ................. H10K 50/824 |

FOREIGN PATENT DOCUMENTS

| | | |
|---|---|---|
| CN | 104716164 A | 6/2015 |
| CN | 104835831 A | 8/2015 |
| CN | 108269944 A | 7/2018 |
| CN | 110112146 A | 8/2019 |
| JP | H10186404 A | 7/1998 |
| JP | 2011071042 A | 4/2011 |

* cited by examiner

ARRAY SUBSTRATE, PREPARATION METHOD THEREFOR, AND DISPLAY DEVICE

CROSS REFERENCE TO RELATED APPLICATIONS

The present disclosure is a National Stage of International Application No. PCT/CN2020/089820, filed on May 12, 2020, which claims the priority of a Chinese patent application filed with the Chinese Patent Office on May 17, 2019 with the application number 201910412086.1 and the application title Array Substrate, Preparation method therefor and Display Panel, and of which the entire content is incorporated in the disclosure by reference.

FIELD

The present disclosure relates to the technical field of display, in particular to an array substrate, a preparation method therefor, and a display device.

BACKGROUND

In recent years, self-luminous devices have been developing rapidly. OLEDs (Organic Light-Emitting Diode) are gaining popularity among panel manufacturers since OLEDs achieve high color gamut, high contrast and flexible display easily; and as the most popular display technology of the next generation, various manufacturers are stepping up research and development of micro LEDs (micro Light-Emitting Diode).

For self-luminous devices such as the OLEDs and micro LEDs, due to the self-luminous characteristic, the self-luminous devices are often liable to be made into bottom-emission panels, that is, light emitted by the light-emitting devices exits through substrates of array substrates for picture information display.

SUMMARY

An embodiment of the present disclosure provides an array substrate which includes:
a substrate including a plurality of sub-pixel regions and a plurality of monochromatic light-emitting regions;
a thin film transistor located in each of the sub-pixel regions on the substrate, and the thin film transistor includes a gate, an active layer, and a source-drain electrode;
a passivation layer located on a side, away from the substrate, of the thin film transistor;
a color resist located on a side, away from the substrate, of the passivation layer and located in the monochromatic light-emitting regions;
a planarization layer located on a side, away from the substrate, of the color resist and the passivation layer;
an anode located on a side, away from the substrate, of the planarization layer and electrically connected to a drain electrode in the source-drain electrode through a first through hole penetrating through the passivation layer and the planarization layer; and
dielectric layers located between the source-drain electrode and the substrate, wherein a thickness of at least one of the dielectric layers between the first through hole and the substrate is greater than a thickness of at least one of the dielectric layers between the color resist and the substrate.

In some embodiments of the present disclosure, the dielectric layers include: a buffer layer located between the substrate and the thin film transistor, and a thickness of the buffer layer between the thin film transistor and the substrate is greater than a thickness of the buffer layer between the color resist and the substrate.

In some embodiments of the present disclosure, the thickness of the buffer layer between the thin film transistor and the substrate is twice the thickness of the buffer layer between the color resist and the substrate.

In some embodiments of the present disclosure further includes: a light-shielding metal layer located between the substrate and the buffer layer, and the drain electrode is electrically connected to the light-shielding metal layer through a second through hole penetrating through the buffer layer;
orthographic projections of the second through hole and the first through hole on the substrate do not overlap; and
a thickness of a part, adjacent to the second through hole, of the buffer layer is smaller than the thickness of the buffer layer between the thin film transistor and the substrate.

In some embodiments of the present disclosure, the dielectric layers include: a gate insulation layer located between the gate and the active layer, and a thickness of the gate insulation layer between the first through hole and the substrate is greater than a thickness of the gate insulation layer between the color resist and the substrate.

In some embodiments of the present disclosure, the active layer in the thin film transistor is located between the gate and the substrate;
the dielectric layers include: an interlayer dielectric layer between the source-drain electrode and the gate, and the drain electrode is electrically connected to the active layer through a third through hole penetrating through the interlayer dielectric layer;
orthographic projections of the third through hole and the first through hole on the substrate do not overlap; and
a thickness of the interlayer dielectric layer between the thin film transistor and the substrate is greater than a thickness of the interlayer dielectric layer between the color resist and the substrate.

In some embodiments of the present disclosure, the substrate further includes a plurality of white light-emitting regions; and
a thickness of the passivation layer in the white light-emitting regions is greater than a thickness of the passivation layer in the monochromatic light-emitting regions.

In some embodiments of the present disclosure, the substrate further includes a plurality of white light-emitting regions; and
a thickness of at least one of the dielectric layers in the white light-emitting regions is greater than a thickness of the at least one of the dielectric layers in the monochromatic light-emitting regions.

In some embodiments of the present disclosure, the dielectric layers include: a buffer layer located between the substrate and the thin film transistor, and a thickness of the buffer layer in the white light-emitting regions is greater than a thickness of the buffer layer in the monochromatic light-emitting regions.

In some embodiments of the present disclosure, the dielectric layers include: a gate insulation layer located between the gate and the active layer, and a thickness of the gate insulation layer in the white light-emitting regions is greater than a thickness of the gate insulation layer in the monochromatic light-emitting regions.

In some embodiments of the present disclosure, the active layer in the thin film transistor is located between the gate and the substrate; and the dielectric layers include: an interlayer dielectric layer located between the source-drain electrode and the gate, and a thickness of the interlayer dielectric layer in the white light-emitting regions is greater than a thickness of the interlayer dielectric layer in the monochromatic light-emitting regions.

On the other hand, an embodiment of the present disclosure further provide a preparation method for an array substrate, and the method includes:

forming patterns of a gate, an active layer, a source-drain electrode of a thin film transistor in a sub-pixel region of a substrate;

forming a pattern of a passivation layer on the thin film transistor;

forming a pattern of a color resist in monochromatic light-emitting regions on the passivation layer;

forming a pattern of a planarization layer on the color resist and the passivation layer; and forming a pattern of an anode on the planarization layer, wherein the anode is electrically connected to a drain electrode in the source-drain electrode through a first through hole penetrating through the passivation layer and the planarization layer; wherein the forming the thin film transistor further includes: forming a pattern of dielectric layers between the source-drain electrode and the substrate, wherein the pattern of at least one of the dielectric layers formed through a half-tone mask and a once patterning process is formed in a mode that: a thickness of the at least one of the dielectric layers between the first through hole and the substrate is greater than a thickness of the at least one of the dielectric layers between the color resist and the substrate.

In some embodiments of the present disclosure, the forming the pattern of the dielectric layers between the source-drain electrode and the substrate includes:

depositing an organic silicon glass solution for forming a buffer layer on the substrate and performing a pre-baking process before forming the thin film transistor;

adopting a half-tone mask to expose and develop the buffer layer subjected to the pre-baking process, wherein the pattern of the buffer layer is formed in a mode that: a thickness of a region of the buffer layer where the thin film transistor is to be formed is greater than a thickness of a region of the buffer layer where the color resist is to be formed; and performing a post-baking process on the buffer layer to form a dense $SiO_x$ material.

In some embodiments of the present disclosure, the forming the pattern of the passivation layer on the thin film transistor includes:

depositing an organic silicon glass solution for forming the passivation layer on the thin film transistor and performing a pre-baking process;

adopting a half-tone mask to expose and develop the passivation layer subjected to the pre-baking process, wherein the pattern of the passivation layer is formed in a mode that: a thickness of the passivation layer in the white light-emitting regions is greater than a thickness of the passivation layer in the monochromatic light-emitting regions; and performing a post-baking process on the passivation layer to form a dense $SiO_x$ material.

On the other hand, embodiments of the present disclosure further provide a display device which includes the above-mentioned array substrate provided by some embodiments of the present disclosure.

DETAILED DESCRIPTION OF THE EMBODIMENTS

Figure 1:
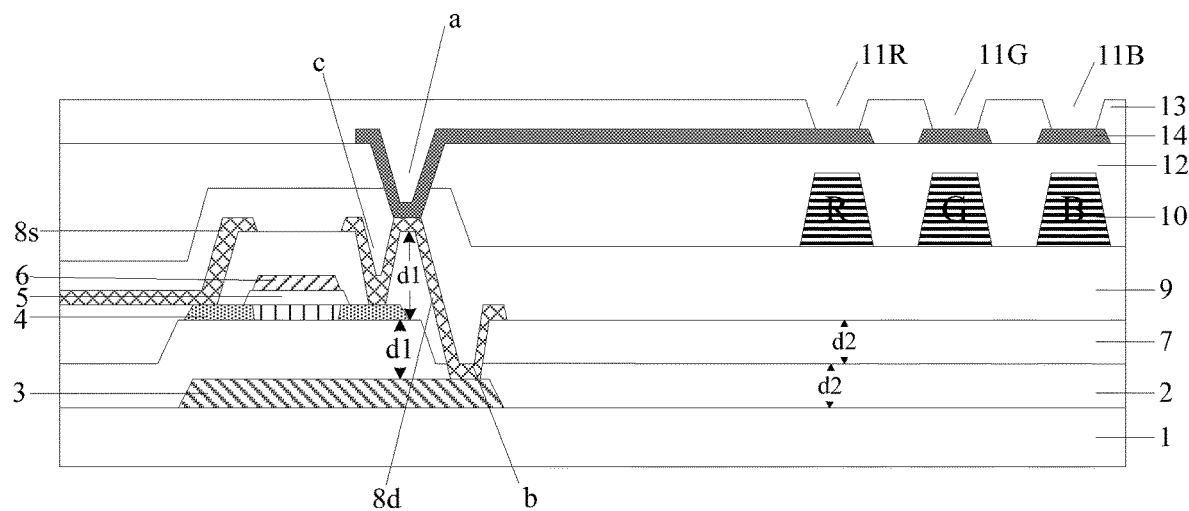
FIG. 1 is a schematic structural diagram of an array substrate provided by an embodiment of the present disclosure.

At present, in a bottom-emission display panel, the color resistant layer is usually arranged on the side, away from a substrate, of a passivation layer in an array substrate. As a result, a planarization layer needing to be covered with the color resistant layer on the surface of the passivation layer is thick, and when an anode is formed on the side, away from the substrate, of the planarization layer, the anode penetrates through the through holes of the passivation layer and the planarization layer to be connected to a source. The following problems are liable to be caused when the planarization layer is too thick, it is laborious to form the through holes allowing the anode to penetrate through in the planarization layer and the passivation layer, for example, when through holes are formed through photolithography and etching, a photoresist needs to be thickened, which leads to longer exposure time, the photoresist is wasted and time cost is increased. However, if the photoresist is not thick enough, the photoresist has been worn out when the through holes are perforated, resulting in damage to the surface of the planarization layer, and the surface roughness of the planarization layer becomes larger, then the anode deposited on the planarization layer is crystallized, the work function of the anode changes, and a light-emitting layer on the anode is very thin, the thinnest region even reaches tens of nanometers. The crystallization of the anode also affects the light-emitting layer, resulting in lower luminous efficiency, changes in luminous color and degradation of luminous performance, for instance, a panel turns yellow during the life test, which eventually leads to poor luminous quality of the display panel.

In order to alleviate the problem caused by the excessively thick planarization layer, embodiments of the present disclosure provide an array substrate, a preparation method therefor, and a display device. The technical solutions in embodiments of the present disclosure are clearly and completely described below in conjunction with the accompanying drawings in embodiments of the present disclosure. Apparently, the described embodiments are only a part of embodiments of the present disclosure, rather than all embodiments. Based on embodiments in the present disclosure, all other embodiments obtained by those of ordinary skill in the art without creative work shall fall within the protection scope of the present disclosure.

An array substrate provided by an embodiment of the present disclosure, as shown in FIG. 1 to FIG. 4, includes:
 a substrate 1 including multiple sub-pixel regions A and multiple monochromatic light-emitting regions R, G and B;
 a thin film transistor which is located in each sub-pixel region A on the substrate 1 and includes a gate 6, an active layer 4, and a source-drain electrode 8 (including a drain electrode 8*d* and a source electrode 8*s*);
 a passivation layer 9 located on the side, away from the substrate 1, of the thin film transistor;
 a color resist 10 located on the side, away from the substrate 1, of the passivation layer 9 and located in the monochromatic light-emitting regions R, G and B;
 a planarization layer 12 located on the side, away from the substrate 1, of the color resist 10 and the passivation layer 9;
 an anode 14 located on the side, away from the substrate 1, of the planarization layer 12, and electrically connected to the drain electrode 8*d* in the source-drain electrode 8 through a first through hole a penetrating through the passivation layer 9 and the planarization layer 12; and
 dielectric layers located between the source-drain electrode 8 and the substrate 1, wherein the thickness d1 of at least one of the dielectric layers between the first through hole a and the substrate 1 is greater than the thickness d2 between the color resist 10 and the substrate 1.

Figure 2:
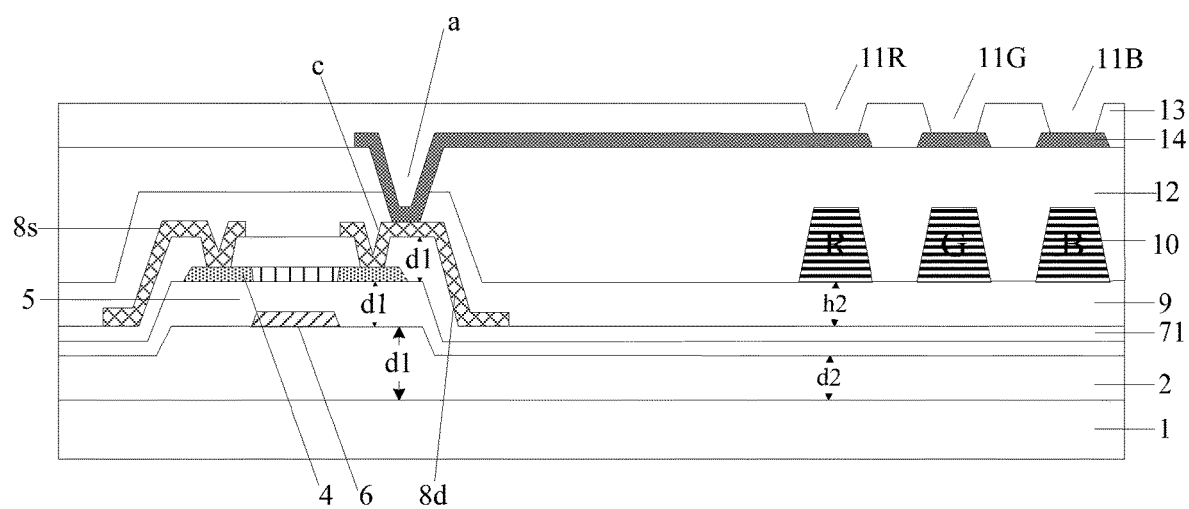
FIG. 2 is an another schematic structural diagram of an array substrate provided by an embodiment of the present disclosure.
Figure 3:
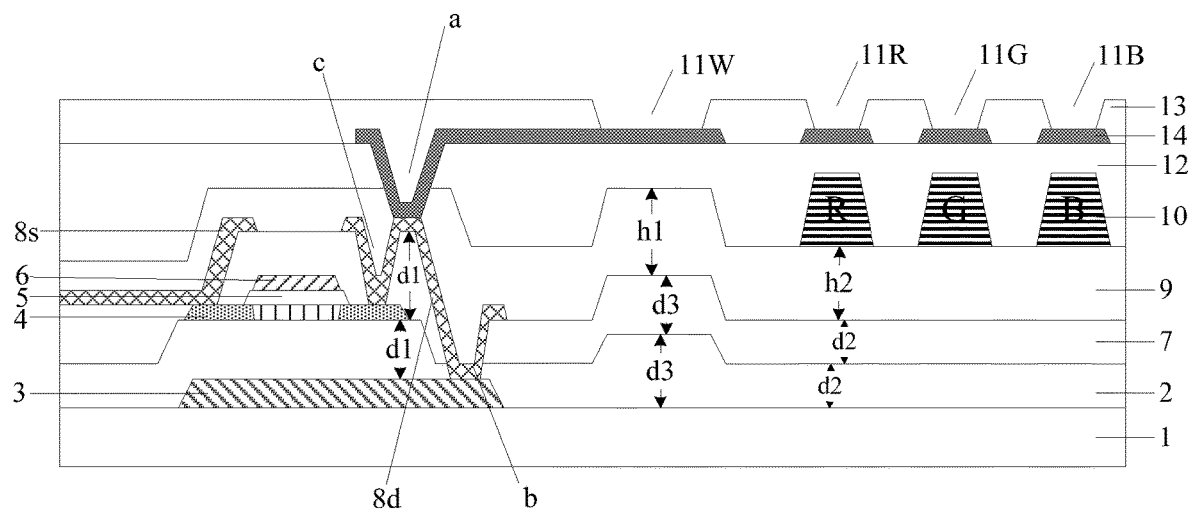
FIG. 3 is an another schematic structural diagram of an array substrate provided by an embodiment of the present disclosure.
Figure 4:
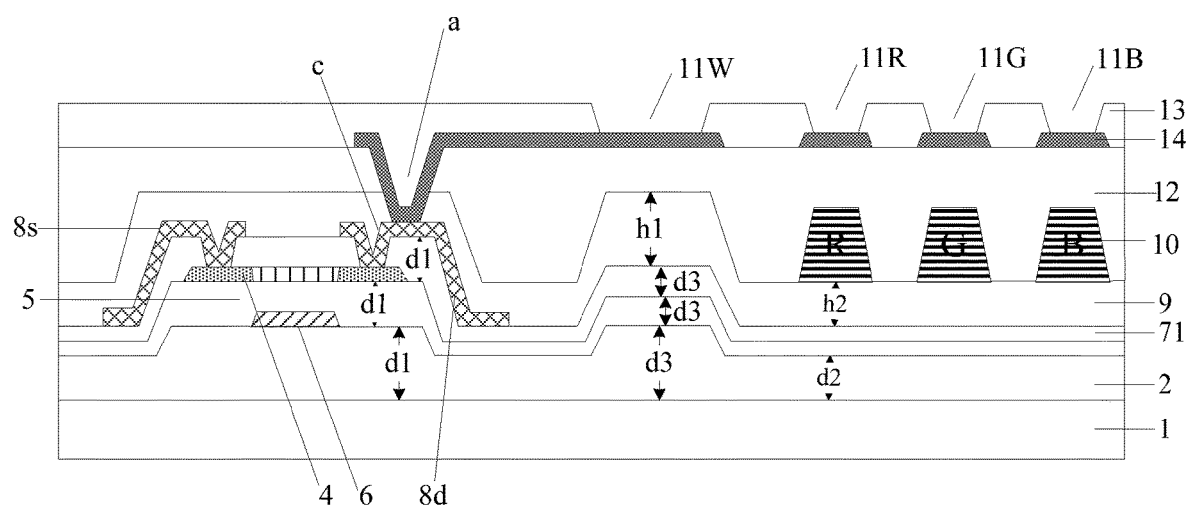
FIG. 4 is an another schematic structural diagram of an array substrate provided by an embodiment of the present disclosure.

In order to facilitate understanding, it is explained here that: W refers to white, R refers to red, G refers to green, and B refers to blue. In addition, only one thin film transistor connected to the anode 14 in the sub-pixel region corresponding to one light-emitting region is shown in FIGS. 1 to 4, the sub-pixel regions corresponding to other light-emitting regions are omitted, and one sub-pixel region is generally not limited to one thin film transistor, and which will not be described in detail here. FIG. 1 and FIG. 3 are schematic diagrams of the structure when the array substrate adopts top-gate thin film transistors, and FIG. 2 and FIG. 4 are schematic diagrams of the structure when the array substrate adopts bottom-gate thin film transistors.

In the above-mentioned array substrate, the color resist 10 is arranged on the side, away from the substrate 1, of the passivation layer 9 in the parts of the monochromatic light-emitting regions R, G and B, which causes the planarization layer 12 on the passivation layer 9 to be too thick, when dielectric layers, such as a buffer layer 2, an interlayer dielectric layer 7, and a gate insulation layer 5, are formed between a source-drain electrode 8 and a substrate 1, the thickness of at least one dielectric layer among the dielectric layers underneath a first through hole a can be increased, which is to say that the drain electrode 8*d* is raised to be further away from the substrate 1, causing the drain electrode to be closer to a surface of a planarization layer 12 that faces away from the substrate 1, i.e., reducing the thickness of a part of the planarization layer 12 above the drain electrode 8*d*. Therefore, when a method such as photolithography or etching is used to form a first through hole a for connecting an anode 14 and a source electrode 8*s* on a planarization layer 12 and a passivation layer 9, and in the situation in which the thickness of the passivation layer 9 is fixed, the distance for which the first through hole a needs to penetrate the planarization layer 12 is shortened. The etching of the first through hole a may be completed merely by depositing a relatively thin layer of photoresist on the surface of the planarization layer 12, which will not extend exposure time, waste the photoresist, or cause damage to the planarization layer 12 and thereby affect light-emitting quality.

Optionally, in the array substrate provided by some embodiments of the present disclosure, as shown in FIG. 1, the dielectric layers may specifically include: a buffer layer 2 located between the substrate 1 and the thin film transistor, that is, a buffer layer 2 may be prepared before the thin film transistor is prepared on the substrate 1; and the thickness d1 of the buffer layer 2 between the thin film transistor and the substrate 1 may be greater than the thickness d2 of the buffer layer 2 between the color resist 10 and the substrate 1, so that the drain electrode 8*d* is raised to reduce the thickness of the part, on the drain electrode, of the planarization layer 12.

Optionally, an organic silicon glass solution (SOG) material may be deposited on the substrate 1 through a spin coating method, the material has the characteristics similar to these of photoresist, and can be directly exposed and developed through a half-tone mask to form the required pattern of the buffer layer 2. Compared with the mode of forming the pattern of the buffer layer 2 through inorganic materials, the process of photoresist coating and the subsequent dry etching process can be omitted, so that the process cost is reduced.

Optionally, in the array substrate provided by some embodiments of the present disclosure, as shown in FIGS. 1 and 3, the thickness d1 of the buffer layer 2 between the thin film transistor and the substrate 1 may be twice the thickness d2 of the buffer layer 2 between the color resist 10 and the substrate 1, that is, the thickness d1 of the buffer layer 2 under the thin film transistor is the largest, and the thickness d2 of the buffer layer 2 under the color resist 10 is half of d1.

Optionally, in the array substrate provided by some embodiments of the present disclosure, as shown in FIG. 1 and FIG. 3, the array substrate may further include: a light-shielding metal layer 3 located between the substrate 1 and the buffer layer 2, and the drain electrode 8d is electrically connected to the light-shielding metal layer 3 through a second through hole b penetrating through the buffer layer 2;

the orthographic projections of the second through hole b and the first through hole a on the substrate 1 generally do not overlap; and the thickness of the part, adjacent to the second through hole b, of the buffer layer 2 is smaller than the thickness d1 of the buffer layer 2 between the thin film transistor and the substrate 1.

Optionally, thin film transistors generally adopted in array substrates may be top-gate thin film transistors, and the thin film transistors of the top-gate structure are higher in Ion and aperture ratio and better in stability than the thin film transistors of the bottom-gate structure. When a top-gate thin film transistor is adopted, in order to ensure that light at the bottom does not irradiate the active layer 4 of the thin film transistor to generate dark current, a light-shielding metal layer 3 is generally arranged under the active layer 4, and the orthographic projection of the light-shielding metal layer 3 on the substrate 1 covers the active layer 4. When a bottom-gate thin film transistor is adopted, since a gate 6 arranged at the bottom covers the active layer 4, the light-shielding metal layer 3 may be omitted. Apparently, the light-shielding metal layer 3 may also be arranged as needed, which is not limited herein.

In addition, in order to ensure that the potential of the light-shielding metal layer 3 does not affect the active layer 4, the light-shielding metal layer 3 and the drain electrode 8d may be electrically connected, and the position of the second through hole b in the buffer layer 2 and the raised part in the buffer layer 2, namely the part with the thickness of d1 do not overlap generally so that the second through hole b in the buffer layer 2 can be advantageously formed in a developing mode.

Optionally, in the array substrate provided by some embodiments of the present disclosure, as shown in FIGS. 2 and 4, the dielectric layers may further include: a gate insulation layer 5 located between the gate 6 and the active layer 4, and the thickness d1 of the gate insulation layer 5 between the first through hole a and the substrate 1 is greater than the thickness d2 of the gate insulation layer 5 between the color resist 10 and the substrate 1, so that the drain electrode 8d is raised to reduce the thickness of the planarization layer 12 on the drain electrode. Alternatively, in a top-gate thin film transistor, the case where the patterns of the gate insulation layer 5 and the gate 6 are the same may exist, and the gate insulation layer is patternless in the first through hole a and the light-emitting regions at this time.

Optionally, in the array substrate provided by some embodiments of the present disclosure, as shown in FIG. 1 and FIG. 3, when the active layer 4 in the thin film transistor is located between the gate 6 and the substrate 1, a thin film transistor of a top gate structure is adopted;

the dielectric layers may further include: an interlayer dielectric layer 7 between the source-drain electrode 8 and the gate 6, and the drain electrode 8d is electrically connected to the active layer 4 through a third through hole c penetrating through the interlayer dielectric layer 7;

the orthographic projections of the third through hole c and the first through hole a on the substrate 1 generally do not overlap; and the thickness d1 of the interlayer dielectric layer 7 between the thin film transistor and the substrate 1 is greater than the thickness d2 of the interlayer dielectric layer 7 between the color resist 10 and the substrate 1, so that the drain electrode 8d is raised to reduce the thickness of the planarization layer 12 on the drain electrode 8d.

Optionally, an organic silicon glass solution (SOG) material may be deposited on the gate 6 through a spin coating method, the material has the characteristics similar to these of photoresist, and can be directly exposed and developed through a half-tone mask to form the required pattern of the interlayer dielectric layer 7. Compared with the mode of forming the pattern of the interlayer dielectric layer 7 through inorganic materials, the process of photoresist coating and the subsequent dry etching process can be omitted, so that the process cost is reduced. Alternatively, the interlayer dielectric layer 7 may be made of single-layer or multi-layer $SiN_x$ or $SiO_x$ inorganic insulating materials, which is not limited herein.

Optionally, when the gate 6 in the thin film transistor is located between the active layer 4 and the substrate 1, a thin film transistor of the bottom-gate structure is adopted; and the dielectric layers may further include: an etching barrier layer 71 between the source-drain electrode 8 and the active layer 4, and the drain electrode 8d can be electrically connected to the active layer 4 through a through hole c penetrating through the etching barrier layer 71, as shown in FIGS. 2 and 4; alternatively, the source-drain electrode 8 may directly make contact with the active layer 4, that is, an etching barrier layer is omitted; and the thickness of the etching barrier layer 71 between the thin film transistor and the substrate 1 may be greater than the thickness of the etching barrier layer 71 between the color resist 10 and the substrate 1, so that the drain electrode 8d is raised to reduce the thickness of the planarization layer 12 on the drain electrode.

It should be noted that, in the above-mentioned array substrate provided by the embodiment of the present disclosure, one layer or multiple layers of thickened dielectric layers may be arranged at the thin film transistor, for example, thickness difference may be formed only in the buffer layer 2 or the interlayer dielectric layer 7, or may be formed in the buffer layer 2, the gate metal layer 5 and the interlayer dielectric layer 7 simultaneously, so that the drain electrode 8d is raised to reduce the thickness of the planarization layer 12 on the drain electrode, which is not limited herein.

Optionally, in the array substrate provided by some embodiments of the present disclosure, as shown in FIG. 3, the substrate 1 may further include multiple white light-emitting regions W to achieve high display brightness; the color resist is not arranged in the white light-emitting regions W generally, therefore, the planarization layer 12 needs to be thick in the white light-emitting regions W to achieve a planarization effect. If the planarization layer 12 in the white light-emitting regions W is too thick, a depression problem may occur, which affects the display quality. In order to reduce the thickness of the planarization layer 12 in the white light-emitting regions W, the thickness h1 of the passivation layer 9 in the white light-emitting regions W may be greater than the thickness h2 of the passivation layer 9 in the monochromatic light-emitting regions R, G and B, that is, the passivation layer 9 is raised in the white light-emitting regions W to reduce the thickness of the planarization layer 12 on the passivation layer.

Optionally, an organic silicon glass solution (SOG) material may be deposited on the substrate 1 through a spin coating method, the material has the characteristics similar to these of photoresist, and can be directly exposed and developed through a half-tone mask to form the required pattern of the passivation layer 9. Compared with the mode of forming the pattern of the passivation layer 9 through inorganic materials, the process of photoresist coating and the subsequent dry etching process can be omitted, so that the process cost is reduced. Apparently, the passivation layer 9 may also be formed by overlapping one or more of $SiN_x$, $SiO_x$ or $SiO_xN_y$, which is not limited herein.

Optionally, in the array substrate provided by some embodiments of the present disclosure, other methods may be adopted to reduce the thickness of the planarization layer 12 in the white light-emitting regions W, for example, on the basis of increasing the thickness of the passivation layer 9 in the white light-emitting regions W, or the thickness d3 of at least one of the dielectric layers in the white light-emitting regions W is directly set to be greater than the thickness d2 in the monochromatic light-emitting regions R, G and B.

Optionally, in the array substrate provided by some embodiments of the present disclosure, as shown in FIG. 3, when the dielectric layers specifically include a buffer layer 2 located between the substrate 1 and the thin film transistor, the thickness d3 of the buffer layer 2 in the white light-emitting regions W may be greater than the thickness d2 in the monochromatic light-emitting regions R, G and B, so that the thickness of the planarization layer 12 on the buffer layer is reduced.

Optionally, in the array substrate provided by some embodiments of the present disclosure, as shown in FIG. 4, when the dielectric layers specifically include a gate insulation layer 5 located between the gate 6 and the active layer 4, the thickness d3 of the gate insulation layer 5 in the white light-emitting regions W may be greater than the thickness d2 in the monochromatic light-emitting regions R, G and B to reduce the thickness of the planarization layer 12 on the gate insulation layer 5.

Optionally, in the array substrate provided by some embodiments of the present disclosure, as shown in FIG. 3, when the active layer 4 in the thin film transistor is located between the gate 6 and the substrate 1, and the dielectric layers specifically include the interlayer dielectric layer 7 located between the source-drain electrode 8 and the gate 6, the thickness d3 of the interlayer dielectric layer 7 in the white light-emitting regions W may be greater than the thickness d2 in the monochromatic light-emitting regions R, G and B.

It should be noted that in the above-mentioned array substrate provided by the embodiment of the present disclosure, one layer or multiple layers of thickened dielectric layers may be arranged at the white light-emitting regions W, for example, thickness difference may be formed only in the buffer layer 2 or the interlayer dielectric layer 7, or may be formed in the buffer layer 2, the gate metal layer 5 and the interlayer dielectric layer 7 simultaneously, so that the thickness of the planarization layer 12 on the dielectric layers is reduced, which is not limited herein.

Figure 5:
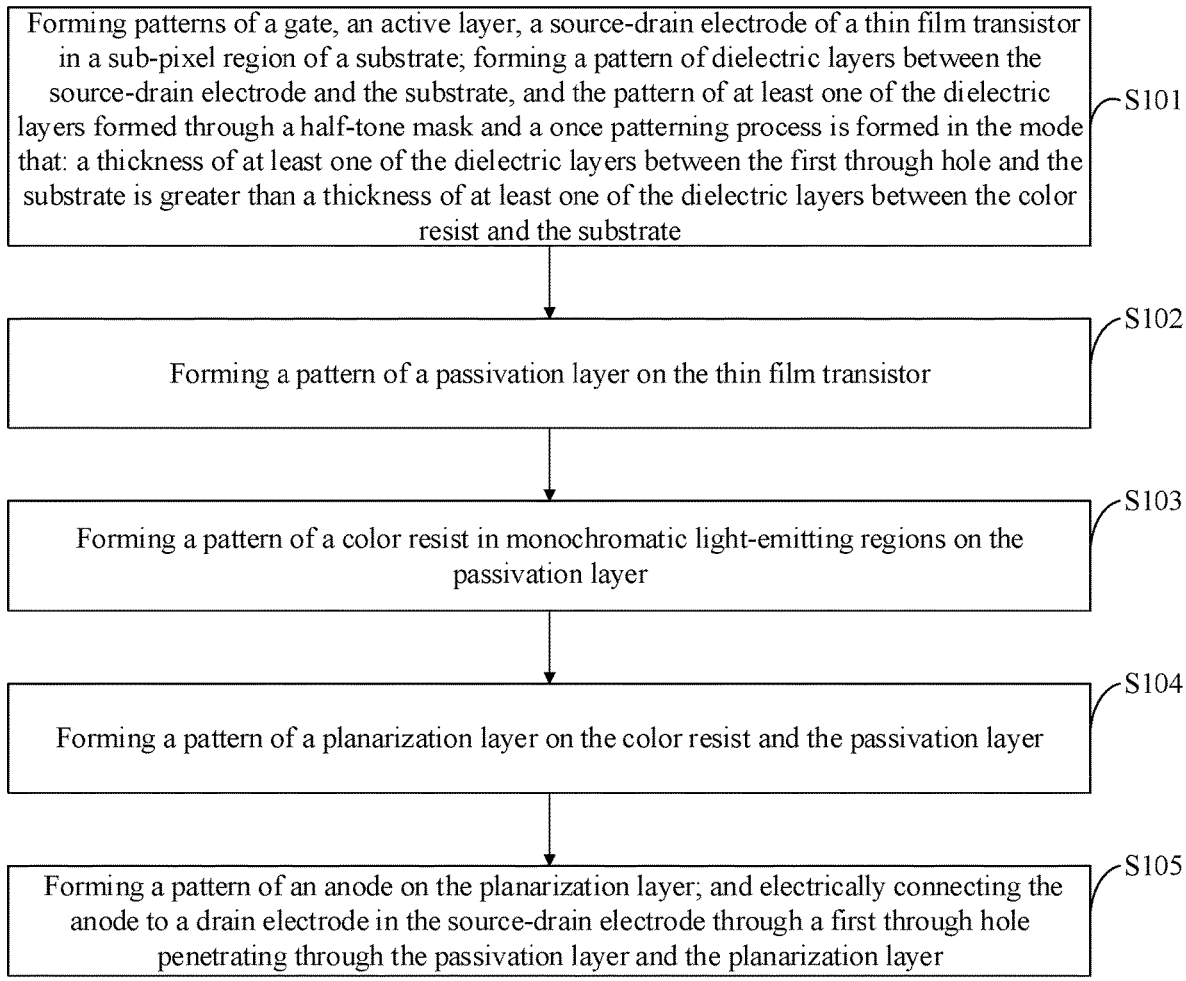
FIG. 5 is a schematic flow chart of a preparation method for an array substrate provided by an embodiment of the present disclosure.

Based on the same inventive concept, some embodiments of the present disclosure further provide a preparation method for an array substrate, as shown in FIG. 5, the preparation method may include the following steps:

S101, patterns of a gate, an active layer, a source-drain electrode of a thin film transistor are formed in a sub-pixel region of a substrate;

S102, a pattern of a passivation layer is formed on the thin film transistor;

S103, a pattern of a color resist is formed in monochromatic light-emitting regions on the passivation layer;

S104, a pattern of a planarization layer is formed on the color resist and the passivation layer; and S105, a pattern of an anode is formed on the planarization layer; and the anode is electrically connected to a drain electrode in the source-drain electrode through a first through hole penetrating through the passivation layer and the planarization layer; wherein step S101 of forming the thin film transistor further includes the step of: forming a pattern of dielectric layers between the source-drain electrode and the substrate, wherein the pattern of at least one of the dielectric layers formed through a half-tone mask and a once patterning process is formed in the mode that: the thickness of the at least one of the dielectric layers between the first through hole and the substrate is greater than the thickness of the at least one of the dielectric layers between the color resist and the substrate.

Optionally, according to the preparation method provided by the embodiment of the present disclosure, the step of forming the pattern of the dielectric layers between the source-drain electrode and the substrate may include the steps:

an organic silicon glass solution for forming a buffer layer is deposited on the substrate and a pre-baking process is performed before forming the thin film transistor;

a half-tone mask is adopted to expose and develop the buffer layer after the pre-baking process, wherein the pattern of the buffer layer is formed in the mode that: the thickness of the region where the thin film transistor is to be formed is greater than the thickness of the region where the color resist is to be formed; and a post-baking process is performed on the buffer layer to form a dense $SiO_x$ material, wherein the temperature of the post-baking process is generally 230-350 DEG C, for example, 230 DEG C, 300 DEG C or 350 DEG C; and the thickness of the dense $SiO_x$ is generally 400-500 nm, for example, 400 nm, 430 nm, 470 nm or 500 nm.

Optionally, according to the preparation method provided by the embodiment of the present disclosure, the step of forming the pattern of the passivation layer on the thin film transistor includes the steps:

an organic silicon glass solution for forming the passivation layer is deposited on the thin film transistor and a pre-baking process is performed;

a half-tone mask is adopted to expose and develop the passivation layer after the pre-baking process, wherein the pattern of the passivation layer is formed in the mode that: the thickness of the passivation layer in the white light-emitting regions is greater than the thickness of the passivation layer in the monochromatic light-emitting regions; and a post-baking process is performed on the passivation layer to form a dense $SiO_x$ material.

Figure 6A:
FIG. 6A is a schematic structural diagram after execution of a step of a preparation method provided by an embodiment of the present disclosure.
Figure 6B:
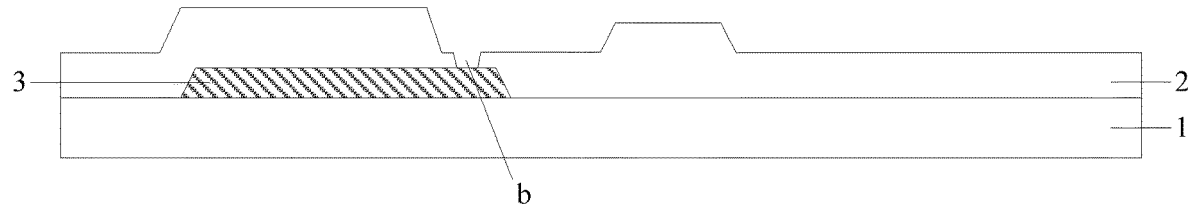
FIG. 6B is a schematic structural diagram after execution of another step of a preparation method provided by an embodiment of the present disclosure.
Figure 6C:
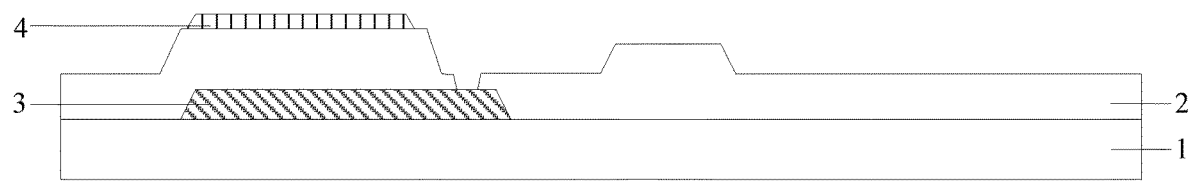
FIG. 6C is a schematic structural diagram after execution of another step of a preparation method provided by an embodiment of the present disclosure.
Figure 6D:
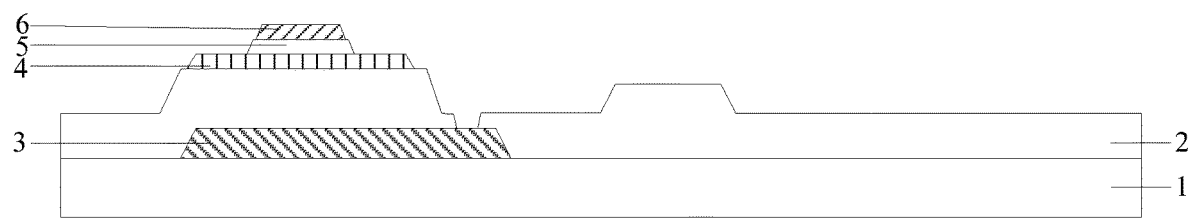
FIG. 6D is a schematic structural diagram after execution of another step of a preparation method provided by an embodiment of the present disclosure.
Figure 6E:
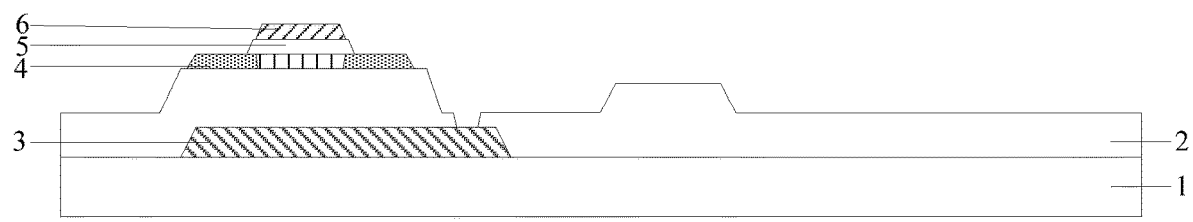
FIG. 6E is a schematic structural diagram after execution of another step of a preparation method provided by an embodiment of the present disclosure.
Figure 6F:
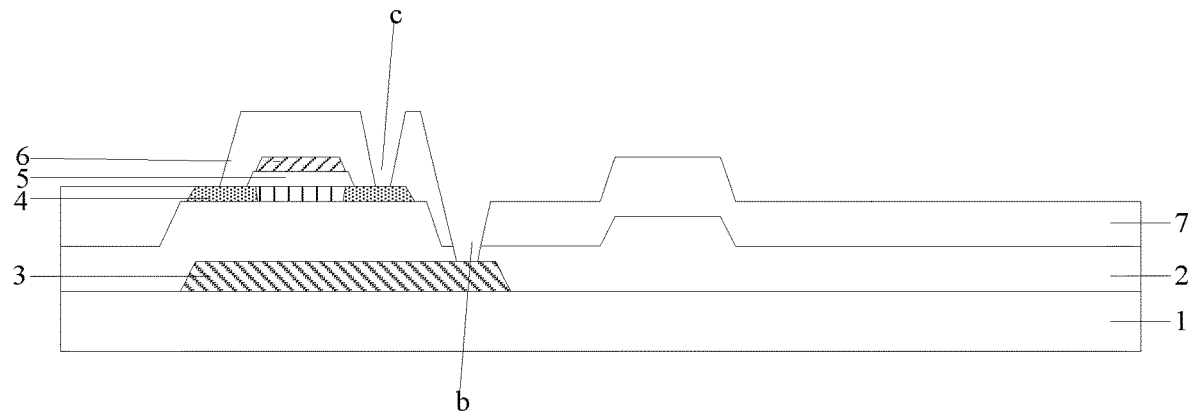
FIG. 6F is a schematic structural diagram after execution of another step of a preparation method provided by an embodiment of the present disclosure.
Figure 6G:
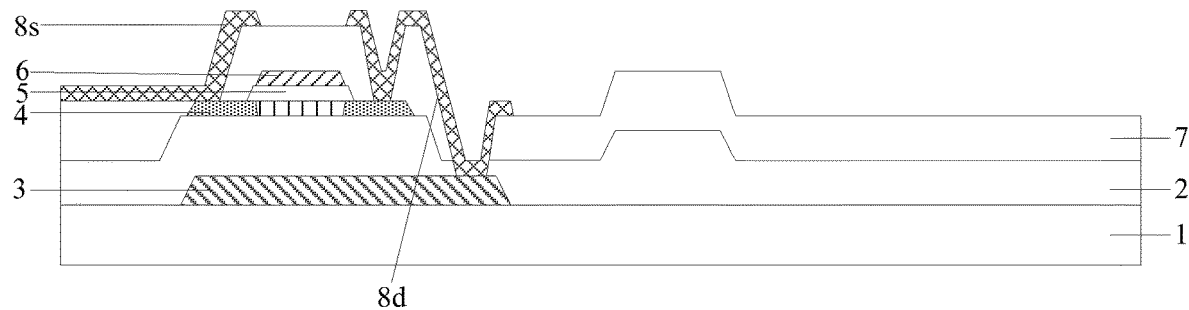
FIG. 6G is a schematic structural diagram after execution of another step of a preparation method provided by an embodiment of the present disclosure.
Figure 6H:
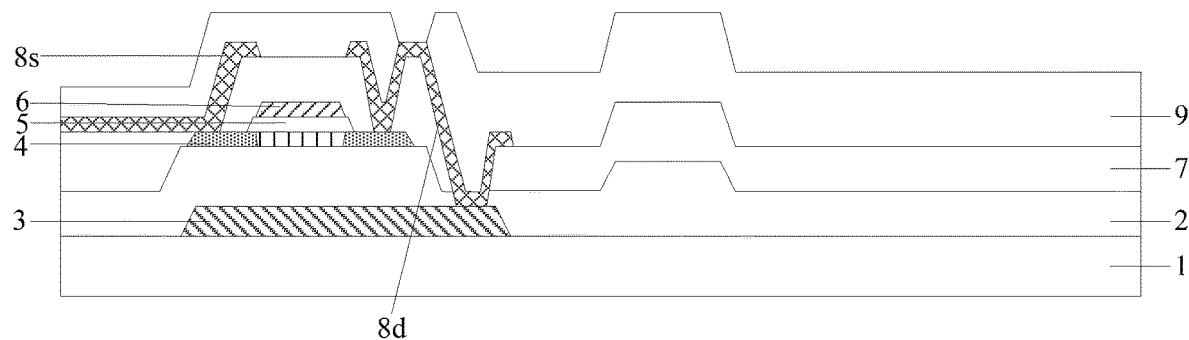
FIG. 6H is a schematic structural diagram after execution of another step of a preparation method provided by an embodiment of the present disclosure.
Figure 6I:
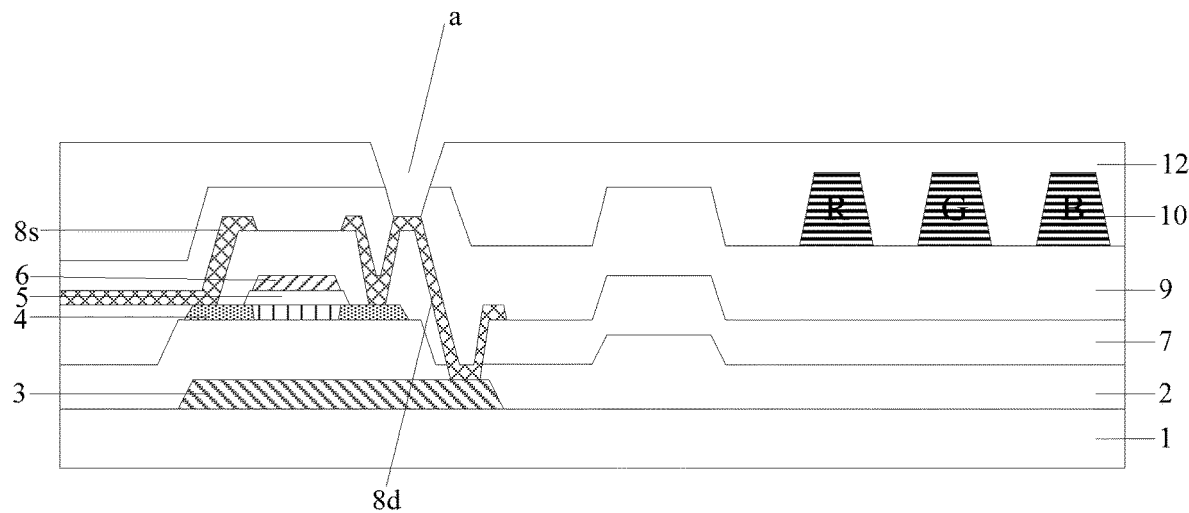
FIG. 6I is a schematic structural diagram after execution of another step of a preparation method provided by an embodiment of the present disclosure.
Figure 6J:
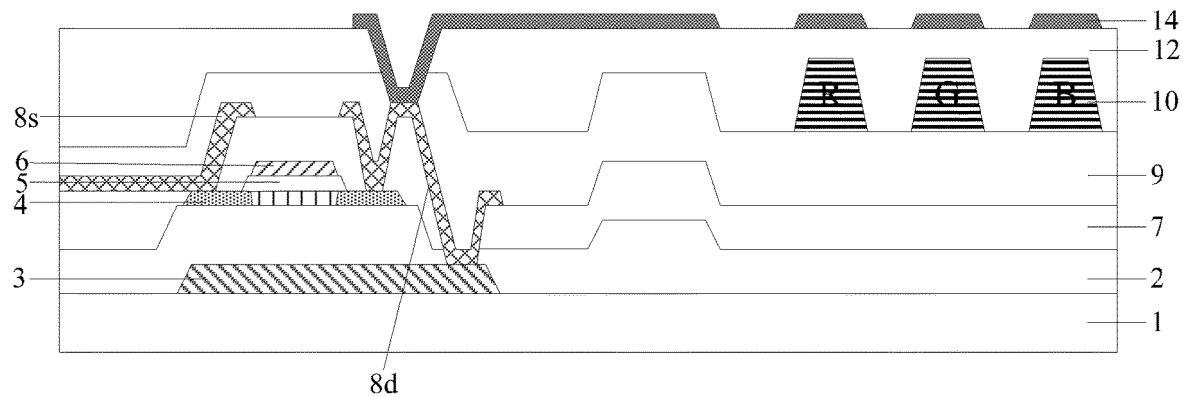
FIG. 6J is a schematic structural diagram after execution of another step of a preparation method provided by an embodiment of the present disclosure.

The top-gate thin film transistor in the array substrate shown in FIG. 3 is taken as an example to illustrate the above-mentioned preparation method provided by embodiments of the present disclosure, wherein the schematic structural diagrams after execution of each step are shown in FIGS. 6A to 6J, and the preparation method specifically includes the following steps:

a whole layer of metal can be deposited on the substrate 1 and then patterned through photolithography and wet etching, and a photoresist on the metal surface is stripped to obtain the pattern of a light-shielding metal layer 3. Then, an organic silicon glass solution (SOG) is deposited through a spin coating method, and a second through hole b connecting the light-shielding metal layer 3 with the drain electrode 8d is exposed after pre-baking, Half-tone Mask process exposure and development, no SOG remains in the second through hole b, and the thickness of the buffer layer 2 in the region where the thin film transistor is located is greater than the thickness in the region where the color resist 10 is located; afterwards, dense $SiO_x$ is formed through post-baking at about 230-350 DEG C, and the final thickness may reach 400-500 nm;

(1) providing a substrate, generally adopting Corning or Asahi Glass with a thickness of 50-1000 μm or others such as quartz glass. Adopting magnetron sputtering equipment to deposit a whole layer of metal on the substrate 1, and obtaining the pattern of a light-shielding metal layer 3 through processes such as photolithography, wet etching patterning and surface photoresist peeling, as shown in FIG. 6A;

(2) depositing an organic silicon glass solution through a spin coating method, forming a second through hole b connecting the light-shielding metal layer 3 with a drain electrode 8d through pre-baking, exposure and development of a Half-tone Mask process, wherein no SOG remains in the second through hole b, and the thickness of the buffer layer 2 in the region where the thin film transistor and the white light-emitting regions W are located is the largest, and the thickness in the other regions is only half of the largest thickness, as shown in FIG. 6B; afterwards, performing a post-baking process at about 230-350 DEG C to form dense $SiO_x$ so that the final thickness can reach 400-500 nm;

(3) adopting the sputter equipment to deposit oxide on the buffer layer 2 as the active layer 4, and obtaining the pattern of an active layer 4 through the processes such as photolithography, wet etching patterning and surface photoresist peeling, as shown in FIG. 6C, wherein the oxide may be amorphous oxides such as IGZO, $ZnO_N$ and ITZO;

(4) depositing a gate insulation layer 5 through a CVD method, and then depositing a gate metal layer on the gate insulation layer through sputter equipment, wherein the thickness of the gate metal layer is 200-1000 nm, materials such as Al, Mo, Cr, Cu, Ti may be adopted, and obtaining the pattern of a gate 6 through photolithography, wet etching patterning and other processes; at the same time, keeping the photoresist being unstripped, and dry-etching the pattern of the gate insulation layer 5 with the photoresist on the gate metal layer as a mask, as shown in FIG. 6D;

(5) conducting conductive treatment on the exposed active layer 4 through any one of $NH_3$, $N_2$ and $H_2$ to reduce the ohmic contact resistance with the source-drain electrode, as shown in FIG. 6E;

(6) depositing a interlayer dielectric layer 7 through PECVD, forming a third through hole c connecting the drain electrode 8d with the active layer 4 through a dry etching process, and forming the second through hole b connecting the drain electrode 8d with the light-shielding metal layer 3 at the same time, as shown in FIG. 6F, wherein the interlayer dielectric layer 7 may be made of a single layer or multilayers of $SiN_x$ or $SiO_x$;

(7) adopting a sputter process to deposit a source-drain electrode metal layer, wherein the source-drain electrode metal layer may be made of Al, Mo, Cr, Cu, Ti and other materials, and may be 200-1000 nm thick, and obtaining the pattern of the source-drain electrode 8 through processes such as photolithography, wet etching patterning and surface photoresist peeling, as shown in FIG. 6G;

(8) depositing a passivation layer 9 by overlapping one or more of $SiN_x$, $SiO_x$ or $SiO_xN_y$ through PECVD with the thickness of 100-500 nm, and obtaining the pattern of the passivation layer 9 through exposure, dry etching and other processes, as shown in FIG. 6H;

(9) coating a color resist R in a monochromatic light-emitting region R on the passivation layer 9 in a slit coating mode, obtaining the pattern of the color resist R through pre-baking, exposure, development and post-baking, and sequentially forming the patterns of color resists G and B according to the process; then, forming a planarization layer 12 on the color resist 10, and coating optical glue on the planarization layer 12, exposing the pattern used for forming a first through hole a, and exposing the pattern of the drain electrode 8d at the first through hole a of the planarization layer 12 after the planarization layer 12 is dry-etched, as shown in FIG. 6I;

(10) depositing an anode layer through a sputter process with a thickness of 200-1000 nm generally, and obtaining the pattern of an anode 14 through exposure, wet etching and other processes, as shown in FIG. 6J. Afterwards, coating an organic material on the anode 14 in a slit coating mode, and obtaining the pattern of a pixel defining layer 13 through pre-baking, exposure, development and post-baking, as shown in FIG. 3.

Optionally, the pixel defining layer 13 is a film layer used for defining the light-emitting regions when the array substrate is applied to an OLED display panel. The pixel defining layer 13 is provided with pixel defining pits 11 corresponding to the light-emitting regions in a one-to-one mode, for example, the pixel defining layer 13 is provided with pixel defining pits 11W corresponding to the white light-emitting regions W, and pixel defining pits 11R, 11G and 11B corresponding to the monochromatic light-emitting regions R, G and B respectively. The pixel defining pits 11 are used for arranging organic light-emitting functional layers. When the array substrate is applied to a micro LED display panel, the pixel defining layer 13 can be omitted, and the micro LED devices can be arranged at positions, corresponding to the light-emitting regions, on the planarization layer 12.

Based on the same inventive concept, an embodiment of the present disclosure further provides a display device including the above-mentioned array substrate provided by the embodiments of the present disclosure. The display device can be any product or component with a display function, such as a mobile phone, a tablet computer, a television, a monitor, a notebook computer, a digital photo frame and a navigator. Other indispensable components of the display device are understood by those of ordinary skill in the art, will not be repeated herein, and should not be regarded as a limitation on the present disclosure. The implementation of the display device may refer to the above-mentioned embodiments of the array substrate, and the repeated parts are not described in detail herein.

Apparently, those skilled in the art can make various modifications and variations to the embodiments of the present disclosure without departing from the spirit and scope of the present disclosure. In this way, if these modifications and variations of the present disclosure fall within the scope of the claims of the present disclosure and equivalent technologies thereof, the present disclosure is also intended to include these modifications and variations.

What is claimed is:

1. An array substrate, comprising:
a substrate comprising a plurality of sub-pixel regions and a plurality of monochromatic light-emitting regions;
a thin film transistor located in each of the sub-pixel regions on the substrate, and the thin film transistor comprises a gate, an active layer, and a source-drain electrode;
a passivation layer located on a side, away from the substrate, of the thin film transistor;
a color resist located on a side, away from the substrate, of the passivation layer and located in the monochromatic light-emitting regions;
a planarization layer located on a side, away from the substrate, of the color resist and the passivation layer;
an anode located on a side, away from the substrate, of the planarization layer and electrically connected to a drain electrode in the source-drain electrode through a first through hole penetrating through the passivation layer and the planarization layer; and
dielectric layers located between the source-drain electrode and the substrate, wherein a thickness of at least one of the dielectric layers between the first through hole and the substrate is greater than a thickness of the at least one of the dielectric layers between the color resist and the substrate;
wherein the dielectric layers comprise: a buffer layer located between the substrate and the thin film transistor, and a thickness of the buffer layer between the thin film transistor and the substrate is greater than a thickness of the buffer layer between the color resist and the substrate.

2. The array substrate according to claim 1, wherein the thickness of the buffer layer between the thin film transistor and the substrate is twice the thickness of the buffer layer between the color resist and the substrate.

3. The array substrate according to claim 1, further comprising: a light-shielding metal layer located between the substrate and the buffer layer, and the drain electrode is electrically connected to the light-shielding metal layer through a second through hole penetrating through the buffer layer;
orthographic projections of the second through hole and the first through hole on the substrate do not overlap; and
a thickness of a part, adjacent to the second through hole, of the buffer layer is smaller than the thickness of the buffer layer between the thin film transistor and the substrate.

4. The array substrate according to claim 1, wherein the dielectric layers further comprise: a gate insulation layer located between the gate and the active layer, and a thickness of the gate insulation layer between the first through hole and the substrate is greater than a thickness of the gate insulation layer between the color resist and the substrate.

5. The array substrate according to claim 1, wherein the active layer in the thin film transistor is located between the gate and the substrate;
the dielectric layers further comprise: an interlayer dielectric layer located between the source-drain electrode and the gate, and the drain electrode is electrically connected to the active layer through a third through hole penetrating through the interlayer dielectric layer;
orthographic projections of the third through hole and the first through hole on the substrate do not overlap; and
a thickness of the interlayer dielectric layer between the thin film transistor and the substrate is greater than a thickness of the interlayer dielectric layer between the color resist and the substrate.

6. The array substrate according to claim 1, wherein the substrate further comprises a plurality of white light-emitting regions; and
a thickness of the passivation layer in the white light-emitting regions is greater than a thickness of the passivation layer in the monochromatic light-emitting regions.

7. The array substrate according to claim 1, wherein the substrate further comprises multiple white light-emitting regions; and
a thickness of at least one of the dielectric layers in the white light-emitting regions is greater than a thickness of the at least one of the dielectric layers in the monochromatic light-emitting regions.

8. The array substrate according to claim 7, wherein a thickness of the buffer layer in the white light-emitting regions is greater than a thickness of the buffer layer in the monochromatic light-emitting regions.

9. The array substrate according to claim 7, wherein the dielectric layers further comprise: a gate insulation layer located between the gate and the active layer, and a thickness of the gate insulation layer in the white light-emitting regions is greater than a thickness of the gate insulation layer in the monochromatic light-emitting regions.

10. The array substrate according to claim 7, wherein the active layer in the thin film transistor is located between the gate and the substrate; and
the dielectric layers further comprise: an interlayer dielectric layer located between the source-drain electrode and the gate, and a thickness of the interlayer dielectric layer in the white light-emitting regions is greater than a thickness of the interlayer dielectric layer in the monochromatic light-emitting regions.

11. A preparation method for the array substrate according to claim 1, comprising:
forming patterns of the gate, the active layer, and the source-drain electrode of the thin film transistor in a sub-pixel region of the substrate;
forming a pattern of the passivation layer on the thin film transistor;
forming a pattern of the color resist in the monochromatic light-emitting regions on the passivation layer;
forming a pattern of the planarization layer on the color resist and the passivation layer; and
forming a pattern of the anode on the planarization layer;
wherein the anode is electrically connected to the drain electrode in the source-drain electrode through the first through hole penetrating through the passivation layer and the planarization layer; wherein
the forming the thin film transistor further comprises: forming a pattern of the dielectric layers between the source-drain electrode and the substrate, wherein the pattern of at least one of the dielectric layers formed through a half-tone mask and a once patterning process is formed in a mode that: the thickness of the at least one of the dielectric layers between the first through hole and the substrate is greater than the thickness of the at least one of the dielectric layers between the color resist and the substrate.

12. The preparation method for the array substrate according to claim 11, wherein the forming the pattern of the dielectric layers between the source-drain electrode and the substrate comprises:
depositing an organic silicon glass solution for forming a buffer layer on the substrate and performing a pre-baking process before forming the thin film transistor;
adopting a half-tone mask to expose and develop the buffer layer subjected to the pre-baking process, wherein the pattern of the buffer layer is formed in a mode that: a thickness of a region of the buffer layer where the thin film transistor is to be formed is greater than a thickness of a region of the buffer layer where the color resist is to be formed; and
performing a post-baking process on the buffer layer to form a dense $SiO_x$ material.

13. The preparation method for the array substrate according to claim 11, wherein the forming the pattern of the passivation layer on the thin film transistor comprises:
depositing an organic silicon glass solution for forming the passivation layer on the thin film transistor and performing a pre-baking process;
adopting a half-tone mask to expose and develop the passivation layer subjected to the pre-baking process, wherein the pattern of the passivation layer is formed in a mode that: a thickness of the passivation layer in the white light-emitting regions is greater than a thickness of the passivation layer in the monochromatic light-emitting regions; and
performing a post-baking process on the passivation layer to form a dense $SiO_x$ material.

14. A display device, comprising the array substrate according to claim 1.

15. An array substrate, comprising:
a substrate comprising a plurality of sub-pixel regions and a plurality of monochromatic light-emitting regions;
a thin film transistor located in each of the sub-pixel regions on the substrate, and the thin film transistor comprises a gate, an active layer, and a source-drain electrode;
a passivation layer located on a side, away from the substrate, of the thin film transistor;
a color resist located on a side, away from the substrate, of the passivation layer and located in the monochromatic light-emitting regions;
a planarization layer located on a side, away from the substrate, of the color resist and the passivation layer;
an anode located on a side, away from the substrate, of the planarization layer and electrically connected to a drain electrode in the source-drain electrode through a first through hole penetrating through the passivation layer and the planarization layer; and
dielectric layers located between the source-drain electrode and the substrate, wherein a thickness of at least one of the dielectric layers between the first through hole and the substrate is greater than a thickness of the at least one of the dielectric layers between the color resist and the substrate;
wherein the dielectric layers comprise: a gate insulation layer located between the gate and the active layer, and a thickness of the gate insulation layer between the first through hole and the substrate is greater than a thickness of the gate insulation layer between the color resist and the substrate.

16. The array substrate according to claim 15, wherein the active layer in the thin film transistor is located between the gate and the substrate;
the dielectric layers further comprise: an interlayer dielectric layer located between the source-drain electrode and the gate, and the drain electrode is electrically connected to the active layer through a third through hole penetrating through the interlayer dielectric layer;
orthographic projections of the third through hole and the first through hole on the substrate do not overlap; and
a thickness of the interlayer dielectric layer between the thin film transistor and the substrate is greater than a thickness of the interlayer dielectric layer between the color resist and the substrate.

17. The array substrate according to claim 15, wherein the substrate further comprises a plurality of white light-emitting regions; and
a thickness of the passivation layer in the white light-emitting regions is greater than a thickness of the passivation layer in the monochromatic light-emitting regions; and/or a thickness of at least one of the dielectric layers in the white light-emitting regions is greater than a thickness of the at least one of the dielectric layers in the monochromatic light-emitting regions.

18. A display device, comprising the array substrate according to claim 15.

19. An array substrate, comprising:
a substrate comprising a plurality of sub-pixel regions and a plurality of monochromatic light-emitting regions;
a thin film transistor located in each of the sub-pixel regions on the substrate, and the thin film transistor comprises a gate, an active layer, and a source-drain electrode;
a passivation layer located on a side, away from the substrate, of the thin film transistor;
a color resist located on a side, away from the substrate, of the passivation layer and located in the monochromatic light-emitting regions;
a planarization layer located on a side, away from the substrate, of the color resist and the passivation layer;
an anode located on a side, away from the substrate, of the planarization layer and electrically connected to a drain electrode in the source-drain electrode through a first through hole penetrating through the passivation layer and the planarization layer; and
dielectric layers located between the source-drain electrode and the substrate, wherein a thickness of at least one of the dielectric layers between the first through hole and the substrate is greater than a thickness of the at least one of the dielectric layers between the color resist and the substrate;
wherein the active layer in the thin film transistor is located between the gate and the substrate;
the dielectric layers comprise: an interlayer dielectric layer located between the source-drain electrode and the gate, and the drain electrode is electrically connected to the active layer through a third through hole penetrating through the interlayer dielectric layer;
orthographic projections of the third through hole and the first through hole on the substrate do not overlap; and
a thickness of the interlayer dielectric layer between the thin film transistor and the substrate is greater than a thickness of the interlayer dielectric layer between the color resist and the substrate.

20. The array substrate according to claim 19, wherein the substrate further comprises a plurality of white light-emitting regions; and a thickness of the passivation layer in the white light-emitting regions is greater than a thickness of the passivation layer in the monochromatic light-emitting regions; and/or a thickness of at least one of the dielectric layers in the white light-emitting regions is greater than a thickness of the at least one of the dielectric layers in the monochromatic light-emitting regions.

* * * * *